US012665578B2

(12) United States Patent
Lin

(10) Patent No.: US 12,665,578 B2
(45) Date of Patent: Jun. 23, 2026

(54) HIGH-SPEED FOUR-PHASE TWENTY-FIVE PERCENT DUTY CLOCK GENERATOR

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 18/975,017

(22) Filed: Dec. 10, 2024

(65) Prior Publication Data

US 2026/0163558 A1 Jun. 11, 2026

(51) Int. Cl.
*H03K 3/017* (2006.01)
*G06F 1/08* (2006.01)
(Continued)

(52) U.S. Cl.
CPC .............. *H03K 3/017* (2013.01); *G06F 1/08* (2013.01); *H03K 3/356113* (2013.01); *H03K 17/133* (2013.01)

(58) Field of Classification Search
CPC ......... H03K 5/133; H03K 2005/00065; H03K 2005/00071; H03K 5/14; H03K 2005/00052; H03K 5/13; H03K 5/00006; H03K 5/135; H03K 2005/00286; H03K 3/0315; H03K 5/1504; H03K 17/6872; H03K 19/09429; H03K 19/20; H03K 3/356121; H03K 3/356139; H03K 5/04; H03K 5/1565; H03K 19/018528; H03K 2005/00026; H03K 2005/0013; H03K 2005/00156; H03K 2005/00195; H03K 2005/00208; H03K 21/10; H03K 23/425; H03K 23/44; H03K 23/483; H03K 23/542; H03K 3/356; H03K 3/356026; H03K 3/356104; H03K 3/35625; H03K 3/37;
(Continued)

(56) References Cited

U.S. PATENT DOCUMENTS 7,460,039 B2 * 12/2008 Jeon ........................ H03M 9/00
341/100
10,148,257 B1 12/2018 Lin
(Continued)

*Primary Examiner* — John W Poos
(74) *Attorney, Agent, or Firm* — McClure, Qualey & Rodack, LLP

(57) ABSTRACT

A four-phase clock generator includes a four-stage ring including four MOS transistors of a first conductivity type, each configured in a common-source arrangement and interconnected in a ring topology to sequentially and cyclically de-assert phases of a four-phase output clock, respectively; a first alternate-phase cross-coupling pair of MOS transistors of the first conductivity type configured to cross couple the first phase and the third phase of the four-phase output clock; a second alternate-phase cross-coupling pair of MOS transistors of the first conductivity type configured to cross couple the second phase and the fourth phase of the four-phase output clock; and an assertion network having four MOS transistors of a second conductivity type configured to sequentially and cyclically assert phases of the output clock in accordance with four gated clock signals generated by alternately gating phases of input and output clocks.

7 Claims, 4 Drawing Sheets

(51) Int. Cl.
 *H03K 3/356* (2006.01)
 *H03K 17/13* (2006.01)

(58) Field of Classification Search
 CPC .......... H03K 5/15013; H03K 5/15066; H03K
 5/151; H03K 17/693; H03K 19/00361;
 H03K 19/1737; H03K 3/354; H03K 5/00;
 H03K 5/082; H03K 5/1508; H03K
 19/0013; H03K 19/0016; H03K 19/0019;
 H03K 2005/00058; H03K 3/356078;
 H03K 5/15; H03K 5/15073; H03K
 5/15093; H03K 5/1515; G06F 1/10; G06F
 7/68; G06F 13/4243; G06F 13/4256;
 G06F 1/04; G06F 1/06; G06F 9/30043;
 G06F 9/30145; G06F 9/3869; H03M
 9/00; H03M 1/0604; H03M 1/0872;
 H03M 1/1061; H03M 1/1215; H03M
 1/123; H03M 1/14; H03M 1/145; H03M
 1/361; H03M 1/368; H03M 1/42; H03M
 1/468; H03M 1/50; H03M 1/56; H03M
 1/002; H03M 1/38; H03M 1/1245; H03F
 2203/45418; H03F 2203/45446; H03F
 3/45192; H03F 3/45237; H03F 3/4565;
 H03F 3/45659
 See application file for complete search history.

(56) References Cited

U.S. PATENT DOCUMENTS

| | | | | |
|---|---|---|---|---|
| 11,728,793 | B1 * | 8/2023 | Lin ...................... | H03K 3/0322 |
| | | | | 327/199 |
| 2004/0100947 | A1 * | 5/2004 | Masaki ................... | H03M 9/00 |
| | | | | 370/366 |
| 2009/0289679 | A1 * | 11/2009 | Kuroki ................ | H03K 5/1565 |
| | | | | 327/261 |

* cited by examiner

300—➚

HIGH-SPEED FOUR-PHASE TWENTY-FIVE PERCENT DUTY CLOCK GENERATOR

BACKGROUND OF THE DISCLOSURE

Field of the Disclosure

The present disclosure generally relates to clock generators, and particularly to high-speed clock generators that avoid contention between MOS transistors of opposite conductivity types.

Description of Related Art

In the present disclosure, a signal is defined as a voltage of a variable level that carries specific information and may vary over time. The level of the signal at any given moment indicates its state at that moment. A logical signal is characterized by two states: a low state and a high state; the logical signal is deemed high when its voltage level exceeds a predetermined trip point and low otherwise. In reference to a logical signal Q, the phrase "Q is high" or "Q is low" implies "Q is in the high state" or "Q is in the low state," respectively. It is noted that the trip point of a first logical signal may differ from that of a second logical signal. A first logical signal is identified as a logical inversion of a second logical signal when the first logical signal and the second logical signal are always in opposite states, i.e., when the first logical signal is low, the second logical signal is high, and vice versa. A logical signal makes a low-to-high (L2H) transition when a rising edge occurs, and a high-to-low (H2L) transition when a falling edge occurs.

A clock is a logical signal that cyclically alternates between a low state and a high state, with its duty cycle representing the percentage of time the clock remains in the high state. A four-phase clock comprises four clocks, including a first clock, a second clock, a third clock, and a fourth clock, that each have the same waveform but are sequentially and evenly distributed in time; these clocks are referred to as the first phase, second phase, third phase, and fourth phase of the four-phase clock, respectively.

Four-phase clocks, specifically those with 25% duty cycles, are widely used in radio transceivers. U.S. Pat. No. 10,148,257, disclosed by Lin, describes a four-phase 25% duty cycle clock generator consisting of a divide-by-two circuit that receives a two-phase input clock and outputs four interim clocks evenly spaced in time. A duty converter then utilizes the timing relationship between the input clock and the four interim clocks to convert their duty cycle to 25%, thereby generating a four-phase 25% duty cycle clock. However, the duty converter consumes power. In U.S. Pat. No. 11,728,793, Lin discloses a four-phase 25% duty cycle clock generator based on a 4-stage gated ring oscillator, where the output inherently has a 25% duty cycle, thus eliminating the need for duty conversion. The gated ring oscillator, however, is limited in speed, due to that a H2L transition of a phase carried out by an NMOS (n-channel metal oxide semiconductor) transistor is hindered by a PMOS (p-channel metal oxide semiconductor) transistor.

What is desired is four-phase 25% duty clock generator that not only inherently generates 25% duty cycle clock but also allows a high operational speed wherein a H2L transition or a L2H transition carried out by a transistor of a first conductivity type will not be hindered by a transistor of a second conductivity.

BRIEF DESCRIPTION OF THIS DISCLOSURE

An objective of this present invention is to have a four-phase (hereafter 4-phase) clock generator that can output a 4-phase output clock of approximately 25% duty cycle in response to a 2-phase input clock of a duty cycle that is approximately 50%, wherein a transition of state is carried by a MOS (metal-oxide semiconductor) transistor of a first conductivity type is not hindered by a MOS transistor of a second conductivity type.

Another objective of this present invention is to have a four-phase (hereafter 4-phase) clock generator that can output a 4-phase output clock of approximately 75% duty cycle in response to a 2-phase input clock of a duty cycle that is approximately 50%, wherein a transition of state is carried by a MOS (metal-oxide semiconductor) transistor of a first conductivity type is not hindered by a MOS transistor of a second conductivity type.

In one embodiment, a four-phase clock generator comprises: a de-assertion network including four MOS transistors of a first conductivity type, each configured in a common-source arrangement and interconnected in a ring topology to sequentially and cyclically de-assert a first phase, a second phase, a third phase, and a fourth phase of a four-phase output clock, respectively; a first alternate-phase cross-coupling pair of MOS transistors of the first conductivity type configured to cross couple the first phase and the third phase of the four-phase output clock; a second alternate-phase cross-coupling pair of MOS transistors of the first conductivity type configured to cross couple the second phase and the fourth phase of the four-phase output clock; and an assertion network comprising four MOS transistors of a second conductivity type configured to sequentially and cyclically assert the first phase, the second phase, the third phase, and the fourth phase of the four-phase output clock in accordance with four gated clock signals generated by alternately gating a first phase and a second phase of a two-phase input clock using the fourth phase, the first phase, the second phase, and the third phase of the four-phase output clock, respectively.

DETAILED DESCRIPTION OF THIS DISCLOSURE

Figure 1A:
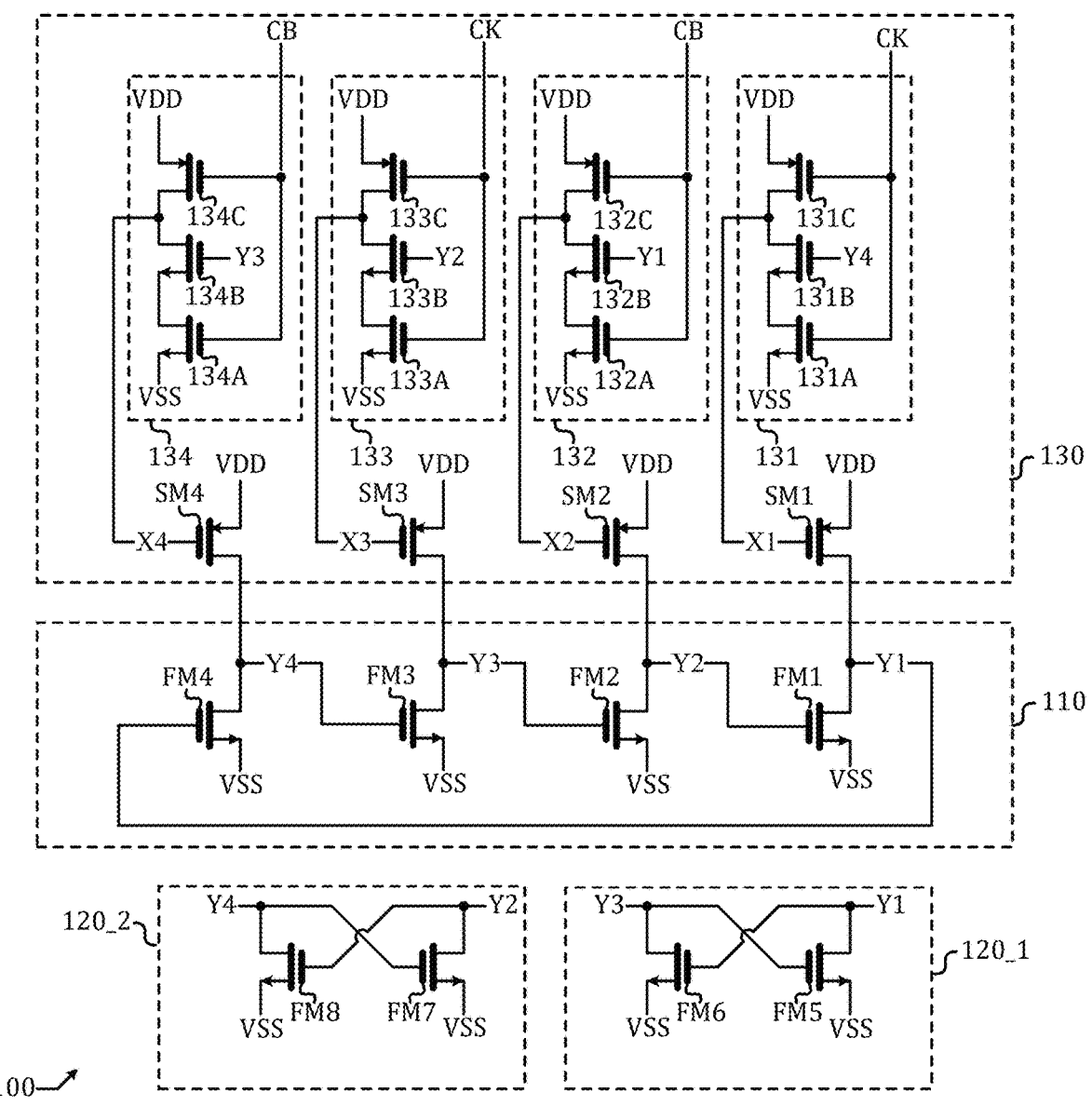
FIG. 1A shows a schematic diagram of a 4-phase clock generator in accordance with an embodiment of the present disclosure.

The present disclosure is directed to four-phase clock generator. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons having ordinary skill in the art are familiar with terms and basic concepts related to microelectronics as used in this disclosure, such as "voltage," "signal," "logical signal," "clock," "phase," "duty cycle," "period," "common-source," "power supply," "ground," "CMOS (complementary metal-oxide semiconductor)," "NMOS (n-channel metal-oxide semiconductor) transistor," "PMOS (p-channel metal-oxide semiconductor) transistor," and "cross couple." These terms are used within the context of microelectronics, and the associated concepts are apparent to those skilled in the art, thereby obviating the need for a detailed explanation herein.

Those skilled in the art can recognize a MOS (metal-oxide semiconductor) transistor symbol and identify the "source," the "gate," and the "drain" terminals thereof for both PMOS (p-channel metal-oxide semiconductor) and NMOS (n-channel metal-oxide semiconductor) transistors. Those skilled in the art can interpret schematics of circuits comprising PMOS and/or NMOS transistors without requiring an exhaustive description of how each component connects with another in the schematics.

This present disclosure is described from an engineering standpoint. For example, with reference to two variables, X and Y, when it is stated that "X is equal to Y," it signifies that "X is approximately equal to Y," denoting that "a difference between X and Y is within a specified engineering tolerance." Similarly, when it is asserted that "X is zero," it implies that "X is approximately zero," meaning that "X is within a specified engineering tolerance." The expression "X is substantially smaller than Y" denotes that "X is negligible with respect to Y," indicating that "the ratio between X and Y is within a specified engineering tolerance, thereby rendering X negligible in comparison to Y."

A power supply node refers to a circuit node possessing a voltage that is approximately equal to a power supply voltage, which is greater than zero but may exhibit minor high-frequency fluctuations. Conversely, a ground node is a circuit node maintaining a voltage that is approximately zero, albeit with potential minor high-frequency fluctuations. Throughout this disclosure, the term "VDD" represents a power supply node, while "VSS" denotes a ground node.

An NMOS transistor is configured in a "common-source" topology in which an input signal is applied to its gate terminal, an output signal is derived from its drain terminal, and its source terminal is coupled to a ground node. Conversely, a PMOS transistor is configured in a "common-source" topology in which an input signal is applied to its gate terminal, and an output signal is derived from its drain terminal, and its source terminal is coupled to a power supply node.

A first MOS transistor and a second MOS transistor of the same conductivity type are configured in a "cross-coupling" topology when a drain of the first MOS transistor is connected to a gate of the second MOS transistor, and a drain of the second MOS transistor is connected to a gate of the first MOS transistor.

As depicted in FIG. 1A, a 4-phase clock generator 100 in accordance with an embodiment of the present invention comprises: a de-assertion network 110 comprising four NMOS transistors FM1, FM2, FM3, and FM4, each being configured in a common-source arrangement, interconnected in a ring topology to sequentially and cyclically de-assert a first phase Y1, a second phase Y2, a third phase Y3, and a fourth phase Y4 of a four-phase output clock, respectively; a first alternate-phase cross-coupling pair 120_1 comprising two NMOS transistors FM5 and FM6 configured to cross couple Y1 with Y3; a second alternate-phase cross-coupling pair 120_2 comprising two NMOS transistors FM7 and FM8 configured to cross couple Y2 with Y4; and an assertion network 130 comprising four PMOS transistors SM1, SM2, SM3, and SM4 configured to sequentially and cyclically assert Y1, Y2, Y3, and Y4 in accordance with four gated clock signals X1, X2, X3, and X4 generated by alternately gating a first phase CK and a second phase CB of a two-phase input clock using Y4, Y1, Y2, and Y3, respectively using a first clock-gating network 131, a second clock-gating network 132, a third clock-gating network 133, and a fourth clock-gating network 134, respectively. The first (second, third, fourth) clock-gating network 131 (132, 133, 134) comprises a stack-up of two NMOS transistors 131A (132A, 133A, 134A) and 131B (132B, 133B, 134B) controlled by CK (CB, CK, CB) and Y4 (Y1, Y2, Y3), respectively, and a PMOS transistor 131C (132C, 133C, 134C) controlled by CK (CB, CK, CB), so that X1 (X2, X3, X4) is low when both CK (CB, CK, CB) and Y4 (Y1, Y2, Y3) are high. As such, Y1 (Y2, Y3, Y4) is asserted, i.e., pulled high, by PMOS transistor SM1 (SM2, SM3, SM4) in response to a H2L, i.e., high-to-low, transition of X1 (X2, X3, X4) and then de-asserted, i.e., pulled low by NMOS transistor FM1 (FM2, FM3, FM4) in response to a L2H, i.e., low-to-high, transition of Y2 (Y3, Y4, Y1). The assertion of Y1, Y2, Y3, and Y4 occurs sequentially and cyclically in response to a L2H transition of either CK or CB, while the de-assertion of Y1, Y2, Y3, and Y4 occurs sequentially and cyclically in response to a L2H transition of a succeeding phase of the four-phase clock.

Figure 2:
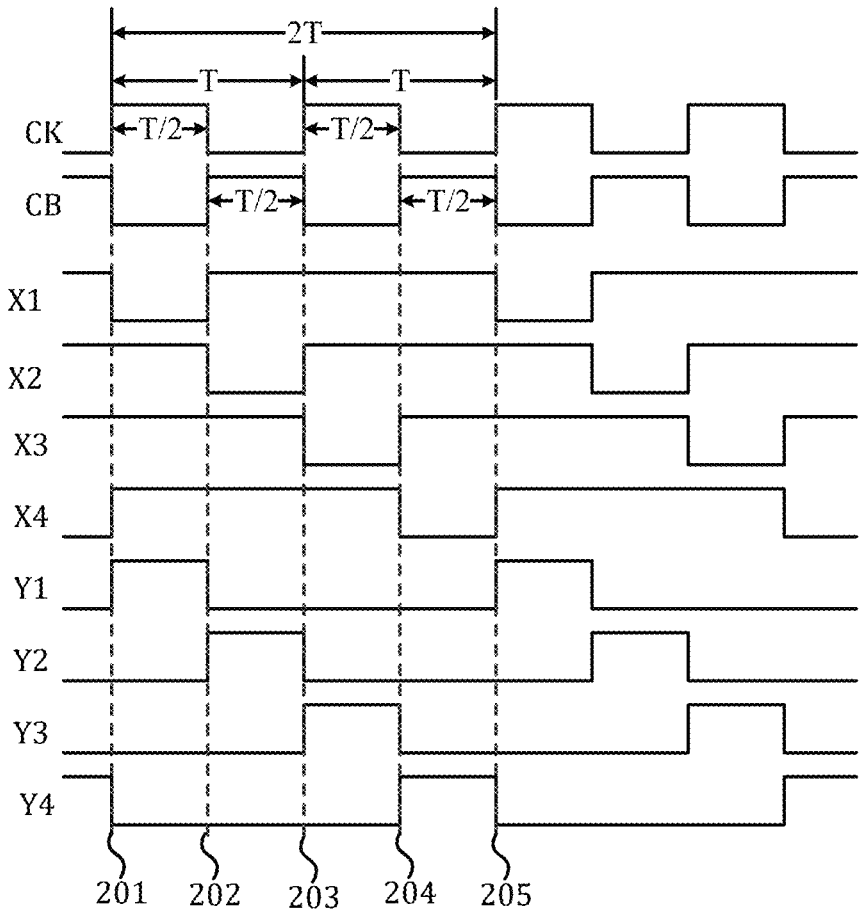
FIG. 2 shows an exemplary timing diagram of the 4-phase clock generator of FIG. 1A.

An illustrative timing diagram of the 4-phase clock generator 100 is shown in FIG. 2. CK and CB are the first phase and the second phase of the two-phase input clock. CB is an inversion of CK, and both have the same period T and pulse width T/2 and thus 50% duty. Initially, CB, X1, X2, X3, and Y4 are high, while CK, X4, Y1, Y2, and Y3 are low. At a first time instant 201, a H2L transition of CB and a L2H transition of CK occur, causing X1 to be pulled low by NMOS transistors 131A and 131B; as a result, Y1 is asserted, i.e., pulled high, by PMOS transistor SM1 and consequently Y4 is de-asserted, i.e., pulled low, by NMOS transistor FM4. At a second time instant 202, a H2L transition of CK and a L2H transition of CB occur, causing X2 to be pulled low by NMOS transistors 132A and 132B; as a result, Y2 is asserted by PMOS transistor SM2 and consequently Y1 is de-asserted by NMOS transistor FM1. At a third time instant 203, a H2L transition of CB and a L2H transition of CK occur, causing X3 to be pulled low by NMOS transistors 133A and 133B; as a result, Y3 is pulled up by PMOS transistor SM3 and consequently Y2 is de-asserted by NMOS transistor FM2. At a fourth time instant 204, a H2L transition of CK and a L2H transition of CB occur and causing X4 to be pulled low by NMOS transistors 134A and 134B; as a result, Y4 is asserted by PMOS transistor SM4 and consequently Y3 is de-asserted by NMOS transistor FM3. At a fifth time instant 205, a H2L transition of CB and a L2H transition of CK occur, causing X1 to be pulled low by NMOS transistors 131A and 131B; as a result, Y1 is asserted by PMOS transistor SM1 and consequently Y4 is de-asserted by NMOS transistor FM4. This completes a cycle of 4-phase clock generation, wherein Y1, Y2, Y3, and Y4 are sequentially asserted, i.e., pulled high, by PMOS transistors SM1, SM2, SM3, and SM4, respectively, in response to a L2H transition of CK and CB alternately. Each time Y1 (Y2, Y3, Y4) is asserted by PMOS transistor SM1 (SM2, SM3, SM4) in response to a L2H transition of CK (CB, CK, CB), it is de-asserted by NMOS transistor FM1 (FM2, FM3, FM4) in response to a subsequent L2H transition of CB (CK, CB, CK). As a result, a pulse width of Y1 (Y2, Y3, Y4) is approximately T/2, a clock period is 2T, and therefore the duty cycle is approximately 25%.

The four-phase clock generator 100 facilitates very high operational speeds. A L2H transition of CK (CB) immediately triggers a H2L transition of X1 (X2) or X3 (X4) alternately, which in turn promptly triggers a L2H transition of Y1 (Y2) or Y3 (Y4) alternately. Subsequently, a L2H transition of any phase immediately triggers a H2L transition of the preceding phase. For any phase, a H2L transition involves a pull-down effected by a single NMOS transistor without interference from a PMOS transistor, which might resist the pull-down. Conversely, a L2H transition involves a pull-down by two stacked NMOS transistors without resistance from a PMOS transistor, followed by a pull-up by a single PMOS transistor, free from opposition by an NMOS transistor.

Figure 1B:
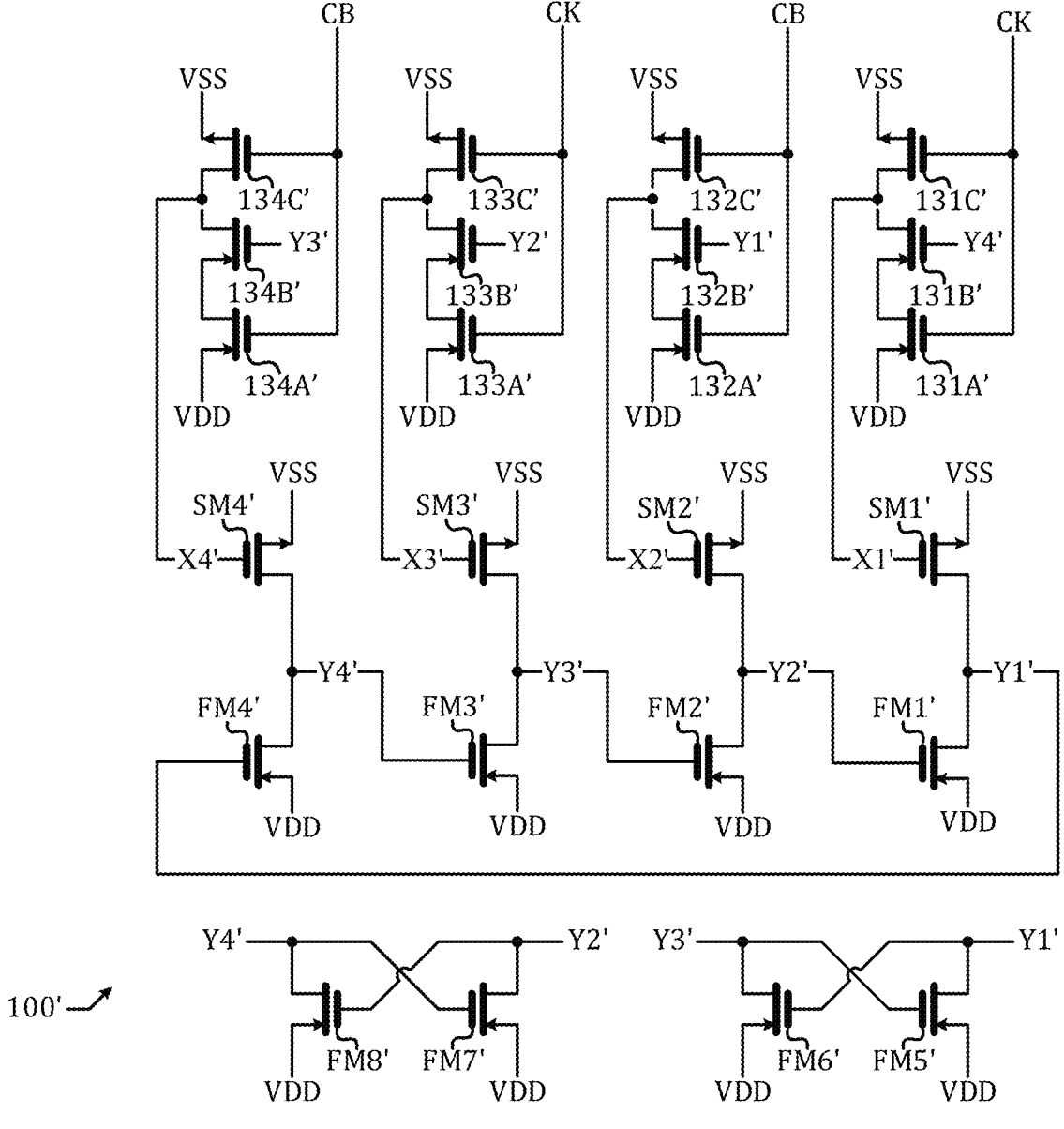
FIG. 1B shows a schematic diagram of an alternative 4-phase clock generator in accordance with another embodiment of the present disclosure.

Any circuit has a complementary counterpart, wherein the power supply node VDD and the ground node VSS are swapped, each NMOS transistor is replaced by an PMOS transistor, and each PMOS transistor is replaced by an NMOS transistor. The complementary counterpart retains the same functional characteristics as the original circuit, with the "high" and "low" states interchanged. An alternative 4-phase clock generator 100' is depicted in FIG. 1B, representing the complementary counterpart of the 4-phase clock generator 100 shown in FIG. 1A. In FIG. 1B, PMOS transistors FM1', FM2', FM3', FM4', FM5', FM6', FM7', FM8', 131A', 131B', 132A', 132B', 133A', 133B', 134A', and 134B' replace NMOS transistors FM1, FM2, FM3, FM4, FM5, FM6, FM7, FM8, 131A, 131B, 132A, 132B, 133A, 133B, 134A, and 134B, respectively. At the same time, NMOS transistors SM1', SM2', SM3', SM4', 131C', 132C', 133C', and 134C' replace PMOS transistors SM1, SM2, SM3, SM4, 131C, 132C, 133C, and 134C, respectively.

Furthermore, each occurrence of "VDD" in FIG. 1A is replaced with "VSS" in FIG. 1B, and each occurrence of "VSS" in FIG. 1A is replaced with "VDD" in FIG. 1B. The signals X1', X2', X3', X4', Y1', Y2', Y3', and Y4' in FIG. 1B are logical inversions of the signals X1, X2, X3, X4, Y1, Y2, Y3, and Y4, respectively, in FIG. 1A. The operational function of the alternative 4-phase clock generator 100' mirrors that of the 4-phase clock generator 100, with the output signals Y1', Y2', Y3', and Y4' forming a 4-phase 75% duty cycle clock signal. If a four-phase 25% duty cycle clock signal is required, the addition of four inverters to convert the 75% duty cycle to a 25% duty cycle would be apparent to one of ordinary skill in the art, and thus further explanation is deemed unnecessary.

In view of the interchangeability of NMOS transistor and PMOS transistors, the appended claims refer to them as "MOS transistor of a first conductivity type" and "MOS transistor of a second conductivity type," respectively, or vice versa. In one embodiment, the "MOS transistor of a first conductivity type" and "MOS transistor of a second conductivity type" are NMOS transistor and PMOS transistor, respectively. In this case, a logical signal is said to be asserted when it is pulled high, and de-asserted when it is pulled low. In another embodiment, the "MOS transistor of a first conductivity type" and "MOS transistor of a second conductivity type" are PMOS transistor and NMOS transistor, respectively. In this case, a logical signal is said to be asserted when it is pulled low, and de-asserted when it is pulled high.

The four-phase clock generator 100 of FIG. 1A is subject to failure if all of Y1, Y2, Y3, and Y4 are low and locked in a dormant state, referred to as a "nil state." In this condition, X1, X2, X3, and X4 will remain high regardless of the states of CK and CB, causing Y1, Y2, Y3, and Y4 to persist in a low state. Consequently, the four-phase clock generator 100 will be perpetually trapped in the nil state unless an intervention occurs.

Figure 3:
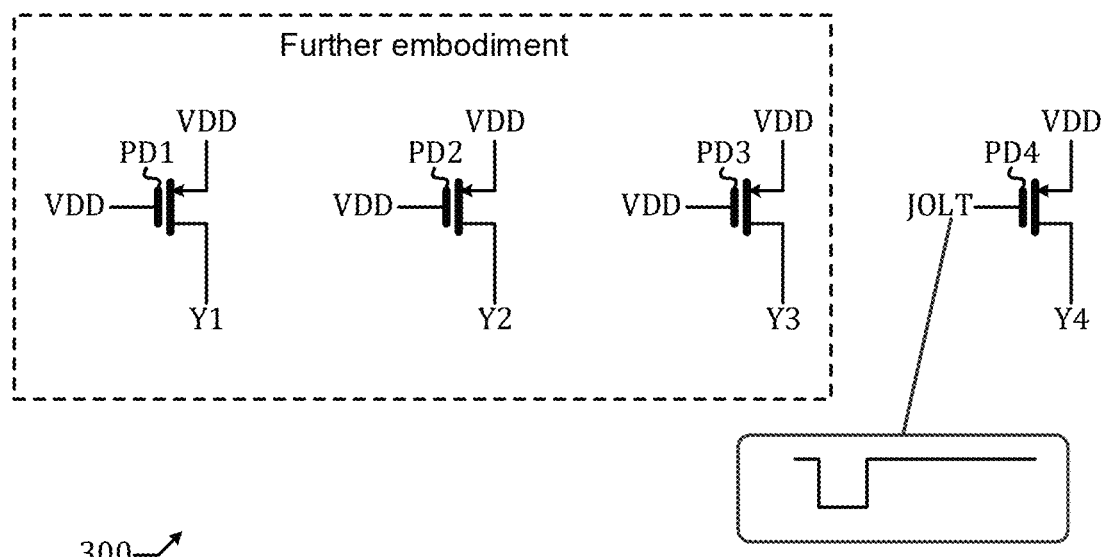
FIG. 3 shows a schematic diagram of a jolt circuit that can be incorporated into the 4-phase clock generator of FIG. 1A.

There are numerous methods to prevent the four-phase clock generator 100 from being trapped in the nil state, provided that at least one of Y1, Y2, Y3, and Y4 is briefly and forcefully pulled high. In an embodiment shown in FIG. 3, a jolting circuit 300 comprises an additional PMOS transistor PD4 configured to pull high Y4 in response to a jolt signal JOLT. The jolt signal JOLT is generally high, except for a brief interval when it is low, causing Y4 to be forcefully pulled high in a one-time manner. This measure prevents the four-phase clock generator 100 from being trapped in the nil state with minimum impact on normal operation, other than introducing a parasitic capacitor attributable to the additional PMOS transistor PD4.

It is noted that the additional PMOS transistor PD4 may introduce an imbalance to the four-phase clock generator 100, resulting in Y4 having a waveform different from Y1, Y2, and Y3. To mitigate this imbalance, in a further embodiment, three dummy PMOS transistors PD1, PD2, and PD3 are incorporated and coupled to Y1, Y2, and Y3, respectively. The gates of the three dummy PMOS transistors PD1, PD2, and PD3 are connected to the power supply node VDD, ensuring that, during normal operation where the JOLT signal is high and of a level equal to VDD, there is no difference among the waveforms of Y1, Y2, Y3, and Y4.

There are various methods to generate the jolt signal JOLT, such as using a power-on reset circuit, which is well known in the prior art and does not require further explanation.

In another embodiment, the jolt signal JOLT is generated by performing a logical "OR" operation on Y1, Y2, Y3, and Y4, such that the jolt signal JOLT is always high unless all of Y1, Y2, Y3, and Y4 are low, i.e. the 4-phase clock generator 100 is in the nil state. When Y1, Y2, Y3, and Y4 are all low, JOLT is low, causing Y4 to be pull high and make the four-phase clock generator 100 escape the nil state. Then, JOLT will turn high shortly after and remain high.

It should be noted that for the alternative four-phase clock generator 100', the nil state will be such that all of Y1', Y2', Y3', and Y4' are high. In this scenario, the PMOS transistor PD4 in the jolting circuit 300 must be replaced by an NMOS transistor coupled to Y4', and the jolting signal JOLT must be replaced by a complementary jolting signal JOLT' that is generally low, except for a brief interval when it is high, causing Y4' to be forcefully pulled low in a one-time manner. Additionally, to alleviate the imbalance, three additional NMOS transistors coupled to Y1', Y2', and Y3' are incorporated, each having a gate connected to VSS. Also, if applicable, the "OR" operation on Y1, Y2, Y3, and Y4 must be replaced by a "AND" operation on Y1', Y2', Y3', and Y4'. This modification should be apparent to those skilled in the art and thus does not require further explanation.

In the appended claims, the phase Y2 (Y3, Y4, Y1) is identified as a succeeding phase of the phase Y1 (Y2, Y3, Y4) and a preceding phase of the phase Y3 (Y4, Y1, Y2). The PMOS transistor SM1 (SM2, SM3, SM4) is designated as the respective PMOS transistor for the phase Y1 (Y2, Y3, Y4) associated with assertion, whereas the NMOS transistor FM1 (FM2, FM3, FM4) is designated as the respective NMOS transistor for the phase Y1 (Y2, Y3, Y4) associated with de-assertion. For the phase Y1 (Y2, Y3, Y4) associated with assertion, X1 (X2, X3, X4) is designated as the respective gated clock signal, and CK (CB, CK, CB) is designated as the respective phase of the two-phase input clock that is gated by its preceding phase Y4 (Y1, Y2, Y3).

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A four-phase clock generator comprising:
a de-assertion network including four MOS (metal-oxide semiconductor) transistors of a first conductivity type, each configured in a common-source arrangement and interconnected in a ring topology to sequentially and cyclically de-assert a first phase, a second phase, a third phase, and a fourth phase of a four-phase output clock, respectively;
a first alternate-phase cross-coupling pair of MOS transistors of the first conductivity type configured to cross couple the first phase and the third phase of the four-phase output clock;
a second alternate-phase cross-coupling pair of MOS transistors of the first conductivity type configured to cross couple the second phase and the fourth phase of the four-phase output clock; and
an assertion network comprising four MOS transistors of a second conductivity type configured to sequentially and cyclically assert the first phase, the second phase, the third phase, and the fourth phase of the four-phase output clock in accordance with four gated clock signals generated by alternately gating a first phase and a second phase of a two-phase input clock using the fourth phase, the first phase, the second phase, and the third phase of the four-phase output clock, respectively, wherein:
each phase of the four-phase clock is de-asserted by a respective MOS transistor of the first conductivity type in response to assertion of a succeeding phase that connects to a gate of the respective MOS transistor,
the phase of the four-phase clock is asserted by a respective MOS transistor of the second conductivity type in response to de-assertion of a respective gated clock signal generated by a respective clock-gating network, and
the respective clock-gating network comprising a stack up of two MOS transistors of the first conductivity type controlled by the respective phase of the two-phase input clock and a preceding phase of the phase of the four-phase clock, respectively, and a MOS transistor of the second conductivity type controlled by the respective phase of the two-phase input clock.

2. The four-phase clock generator of claim 1, wherein the MOS transistor of the first conductivity type is a NMOS (n-channel metal-oxide semiconductor) transistor, while the MOS transistor of the second conductivity type is a PMOS (p-channel metal-oxide semiconductor) transistor.

3. The four-phase clock generator of claim 1, wherein the MOS transistor of the first conductivity type is a PMOS (p-channel metal-oxide semiconductor) transistor, while the MOS transistor of the second conductivity type is a NMOS (n-channel metal-oxide semiconductor) transistor.

4. The four-phase clock of claim 1 further comprising a jolting circuit configured to forcefully assert at least one of the first phase, the second phase, the third phase, and the fourth phase of the four-phase clock for a brief interval in a one-time manner.

5. The four-phase clock of claim 4, wherein the jolting circuit comprises a MOS transistor of the second conductivity type configured to forcefully assert one of the first phase, the second phase, the third phase, and the fourth phase of the four-phase clock in response to a jolt signal.

6. The four-phase clock of claim 5, wherein the jolt signal is generated by a power-on reset circuit.

7. The four-phase clock of claim 5, wherein the MOS transistor of the first conductivity type is a NMOS (n-channel metal oxide) transistor, the MOS transistor of the second conductivity type is a PMOS (p-channel metal oxide) transistor, and the jolt signal is generated by performing a logical OR operation on the first phase, the second phase, the third phase, and the fourth phase of the four-phase clock so that the jolt signal is high unless all of the first phase, the second phase, the third phase, and the fourth phase of the four-phase clock are low.

* * * * *